United States Patent [19]

Andrusch et al.

[11] Patent Number: 5,111,723

[45] Date of Patent: May 12, 1992

[54] PUNCH APPARATUS WITH POSITIVE SLUG REMOVAL

[75] Inventors: Franz Andrusch, Deckenpfronn; Siegfried Beerhalter, Schwaebisch, both of Fed. Rep. of Germany; Wolfgang F. Mueller, Hot Spring Village, Ark.; Felix B. Zykoff, Poughkeepsie, N.Y.

[73] Assignee: International Business Machines Corp., Armonk, N.Y.

[21] Appl. No.: 667,945

[22] Filed: Mar. 12, 1991

[51] Int. Cl.⁵ .............................................. B26D 7/18
[52] U.S. Cl. .......................................... 83/24; 83/55; 83/98; 83/99
[58] Field of Search ............... 83/22, 24, 26, 55, 98, 83/99, 100, 571; 234/1, 97

[56] References Cited

U.S. PATENT DOCUMENTS

| | | | |
|---|---|---|---|
| 3,104,804 | 9/1963 | Kirkowski | 234/131 |
| 3,524,368 | 8/1970 | Goldman | 83/98 |
| 3,580,120 | 5/1971 | Adams et al. | 83/98 |
| 3,602,080 | 8/1971 | Sickel | 83/100 |
| 3,710,666 | 1/1973 | Keyes et al. | 83/99 |
| 3,800,643 | 4/1974 | Scott et al. | 83/100 |
| 4,425,829 | 1/1984 | Kranik et al. | 83/62.1 |
| 4,821,614 | 4/1989 | Fleet et al. | 83/100 |
| 4,872,381 | 10/1989 | Stroms | 83/76.1 |

OTHER PUBLICATIONS

IBM Technical Disclosure Bulletin, vol. 16, No. 12, pp. 3933-3934, May, 1974, J. R. Kranik et al., "Air Spring" Programmable via Punching Head.

IBM Technical Disclosure Bulletin, vol. 13, No. 9, p. 2536, Feb., 1971, C. J. Lucas et al., "Multiple via Punch."

IBM Technical Disclosure Bulletin, vol. 20, No. 4, pp. 1379-1380, Sep. 1977, T. J. Cochran et al., "Automated Punch Apparatus for Forming via Holes in a Ceramic Green Sheet."

Primary Examiner—Hien H. Phan
Attorney, Agent, or Firm—Donald M. Boles

[57] ABSTRACT

A single stroke punch apparatus includes positive removal by compressed air of workpiece slugs which adhere to the punch. A die plate has a series of bushing receiving features formed from two concentric diameters. The die plate has provision for introducing a flow of compressed air into each of the bushing receiving features. A support bushing is mounted in each of the bushing receiving features and has a surface for support of the workpiece which is elevated with respect to the die plate. A slug removal bushing is also mounted in the bushing receiving feature and is pressed into the wall of the support bushing opposite the workpiece supporting surface to form a seal. The wall of the bushing receiving feature, the support bushing, and the slug removal bushing define a passage for the compressed air such that the compressed air impinges upon the punch directly adjacent the end wall of the support bushing to positively remove the punch slug which is adhered to the punch. The slug removal bushing has a passage for disposal of the punch slugs to which a vacuum may be applied to enhance slug disposal.

21 Claims, 2 Drawing Sheets

PUNCH APPARATUS WITH POSITIVE SLUG REMOVAL

TECHNICAL FIELD

This invention relates to punch apparatus for punching holes in thin sheet material. More particularly, in a preferred embodiment, this invention relates to an improved punch apparatus with a positive slug removal feature to enable single stroke punching in materials such as green ceramic sheets.

BACKGROUND OF THE INVENTION

In the manufacture of multilayer ceramic (MLC) substrates for integrated circuit semiconductor package structures, a plurality of green ceramic sheets is formed by doctor blading a slurry containing a resin binder, a particulate ceramic material, solvents, and a plasticizer, drying the doctor bladed sheet, and cutting it into appropriate size sheets. Via holes are then punched for forming electrical interconnections through the sheet. Electrically conductive paste is deposited in the holes and in wiring patterns on the surface of the sheets, the sheets stacked and laminated, and the assembly subsequently fired at a sintering temperature. Punching the via holes in ceramic sheets presents formidable engineering problems in view of their small size and density and the complex hole patterns needed. It is convenient to punch via holes with apparatus of the type disclosed in Lucas et al., IBM Technical Disclosure Bulletin Vol. 13, No. 9, February, 1971, p. 2536, Kranik et al, IBM TDB Vol. 16, No. 12, May, 1974, p. 3933-34, and Kranik et al, U.S. Pat. No. 4,425,829, the disclosures of which are incorporated by reference herein. In these apparatus a plurality of punch elements arranged in a grid on a punch head are indexed over the green sheet which is covered by an interposer mask. The interposer mask contains openings where holes are desired to be punched. When the punch elements contact the interposer mask as the punch head is moved downwardly a hole will be punched where the openings occur since the punch element will pass through the openings in the interposer mask, and through the ceramic green sheet. In other areas covered by the interposer mask, i.e. where holes are not desired, the interposer mask will cause the punch element to be retracted into the head. The sheet is sequentially indexed through a predetermined number of positions to complete the punching of a sheet.

Automated punch apparatus which utilized individually programmable punches have been disclosed in Cochran et al., IBM TDB Vol. 20, No.4, September, 1977, p. 1379, and in Stroms, U.S. Pat. No. 4,872,381, the disclosures of which are incorporated by reference herein. This type of punching apparatus does not require the above described interposer mask, since the individual punching elements can be sequentially activated upon command.

It is essential that the punching operation be rapidly and accurately performed, as well as producing products free from defects. Each green sheet can contain over 100,000 punched holes. A single defect can potentially render a green sheet unsuitable for further processing. Of particular concern is the adherence to the tip of the punch of a slug punched from the sheet. The inherent adhesion characteristics of the unfired green sheet are amplified by the large punching force applied over the small area of the punch tip. The diameter of the punch tip can be as small as 5 to 6 mils in current applications and is expected to be 4 mils or less for advanced substrates, resulting in a pressure at the punch tip on the order of 2700 kg/cm$^2$. If the punch slug adheres to the punch it may be drawn back into the punched hole, causing a substrate defect. To eliminate the likelihood of such defects, it has been standard practice to use two punch strokes for each hole. This practice greatly increases green sheet processing time, however.

The problem of slug adhesion to the punch is not limited to the punching of ceramic green sheets and has been discussed in other punching application references. One method used in punching apparatus for the removal of punch slugs is the use of either pressurized air or a vacuum to force the slug from the punch. Goldman, U.S. Pat. No. 3,524,368, and Adams et al., U.S. Pat. No. 3,580,120, disclose apparatus in which air is channeled through the punch to remove the slug from the tip of the punch. This method is not practical for the punching of extremely small diameter holes, however.

Other applications either direct air into or apply a vacuum to a chamber below the punch to clear the slugs and do not directly address the problem of slug adherence. Examples of such applications are shown in Kirkowski, U.S. Pat. No. 3,104,804; Scott et al., U.S. Pat. No. 3,800,643; and Sickel, U.S. Pat. No. 3,602,080. Keyes et al., U.S. Pat. 3,710,666, does address the adhesion problem and discloses the injection of air into a series of inclined flow passages in a die to produce a whirlpool effect to remove slugs from the punch.

The use of air flow slug removal methods in ceramic green sheet punching to achieve single stroke punching has been attempted. Kranik et al., U.S. Pat. No. 4,425,829, discloses a tube protruding into the die bushing which upwardly injects air into the die cavity below the punching area. This air flow induces circulation in the die bushing cavity which assists in forcibly removing slugs from the punch. This arrangement does not provide the repeatability necessary to achieve single stroke punching.

Stroms, U.S. Pat. No. 4,872,381, discloses injecting air from the die housing through a passage in the die bushing to remove slugs from the punch. This arrangement has also not provided the repeatability necessary to achieve single stroke punching. FIG. 1 is a detailed view of the punch interface of the prior art Stroms apparatus. The usable length "a" of punch 10 is limited by the difficulty of fabricating an accurate, small diameter punch suitable for the rigors of production punching and by the requirement of machining radius "b." This usable length must extend through wall thickness "c" of punch bushing 11, workpiece 12 thickness "d," and the wall thickness "e" of die bushing 13. The accumulation of these dimensions and accompanying tolerances results in a minimal protrusion of the punch beyond surface 15. It is very difficult to cause passage 17 to direct air precisely at surface 15 because of the required wall thicknesses and tolerances involved. In particular, the necessary alignment of bushing passage 17 with housing passage 16 creates tolerance problems. The above described problem is aggravated in a non-programmable multiple punch which additionally requires an interposer thickness.

While both the Kranik and Stroms configurations have been useful in removing slugs from the punch tip, neither configuration provides the 100% slug removal which is required for single stroke punching. A 99.9% slug removal rate on a green sheet containing 100,000 holes results in 100 defects per sheet, any one of which renders the sheet unacceptable for further processing. The problem can be further appreciated by considering that a defect may not be detected until the green sheet is laminated into a substrate containing 60 or more layers.

SUMMARY OF THE INVENTION

The deficiencies of the prior art show that a need exists for an apparatus which will precisely direct an airflow at a punch to remove the punch slug and thus allow single stroke punching. It is, therefore, an object of the present invention to provide a single stroke punching apparatus.

It is a further object of the invention to provide a punch slug removal apparatus which can be easily reworked and which prevents workpiece marring.

It is yet a further object of the invention to provide a punch removal apparatus which precisely directs an airflow at the slug adhered to a punch which minimally protrudes through the die bushing.

It is still another object of the invention to provide a method for single stroke punching using the apparatus of the present invention.

In accordance with these and other objects of the present invention, an apparatus for removing workpiece slugs from a punch is provided which includes a die plate having at least one bushing receiving feature. The die plate has a first surface and provision for introducing a gas flow into the bushing receiving feature. The apparatus also contains at least one support bushing which has an end wall including a surface for supporting a workpiece, the end wall having an opening through which the punch and attached workpiece slug pass. The support bushing is disposed in the bushing receiving feature of the die plate, preferably such that the surface supporting the workpiece is elevated above the first surface of the die plate. The apparatus also includes a slug removal bushing disposed in the bushing receiving feature. A first end of the slug removal bushing is proximate to the end wall of the support bushing and has a clearance for passage of the punch, the attached workpiece slug, and the gas flow which is introduced into the die plate. The bushings and the bushing receiving feature together define a flow passage which directs the gas flow through the clearance in the second bushing to remove the slug from the punch.

The invention also provides a single stroke punch apparatus which includes a punch and a bushing retention die plate. A support bushing is mounted in the die plate and provides support for the workpiece. The support bushing has a clearance for a punch. The apparatus also has a slug removal bushing mounted in the die plate which provides an internal passage for the removal of punch slugs from the apparatus. The slug removal bushing, the support bushing, and the retention means of the die plate define a flow passage from gas flow introduction features in the die plate to the punch clearance of the support bushing.

The invention also provides a method for single stroke punching which includes providing a workpiece receiving surface of a die plate which defines at least one aperture. The method includes punching a slug from the workpiece through a clearance feature in an end wall of a support bushing disposed in the aperture. A gas flow is directed through a flow passage defined by the support bushing, the die plate wall of the aperture, and a slug removal bushing disposed in the aperture. The gas flow impinges on the slug attached to the punch proximate to the end wall of the first bushing to remove the slug from the punch through a slug removal passage in the second bushing.

The foregoing and other objects, features, and advantages of the invention will be apparent from the following, more particular description of a preferred embodiment of the invention as illustrated in the accompanying drawings.

BRIEF DESCRIPTION OF THE DRAWINGS

In the accompanying drawings forming a material part of this disclosure.

DETAILED DESCRIPTION OF THE INVENTION

Figure 2:
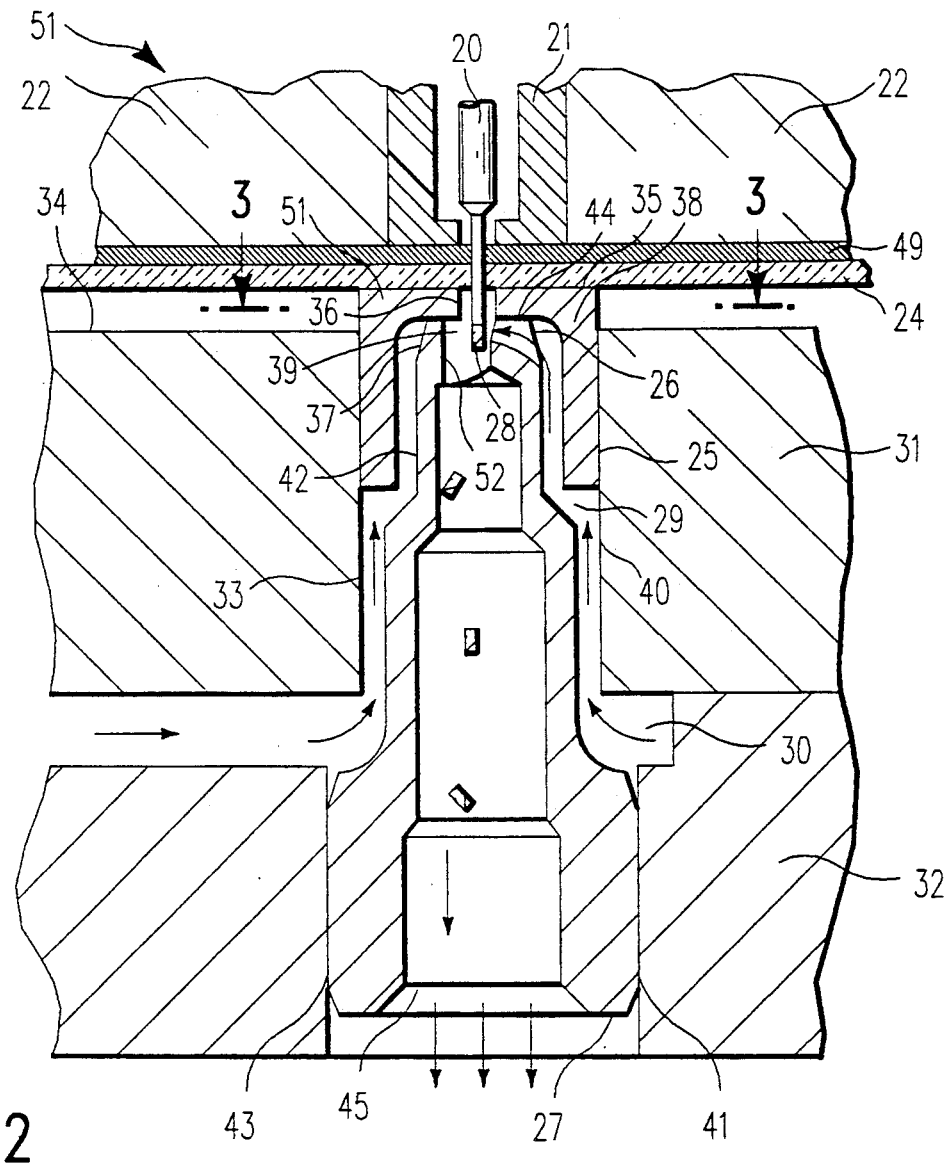
FIG. 2 shows a cross-section of the slug removal apparatus and punch apparatus of the present invention.

Referring to the drawings in more detail, and particularly referring to FIG. 2 of the invention, there is shown the apparatus 50 according to the present invention. A punch 20, which may be an individual punch, but is preferably one of multiple punches in a punch head, such as shown in Kranik et al., U.S. Pat. No. 4,425,829, is located in punch housing 22 by punch bushing 21. Punch 20 punches workpiece 24, which in a preferred embodiment is a ceramic green sheet, removing punch slug 28, which adheres to the end of punch 20. The invention is operative with other workpiece materials and an interposer 49 as shown in FIG. 2 of the attached drawings defining a punch pattern may be placed between punch housing 22 and workpiece 24 if spacing allows. The previously described spacing concerns make individually activated punches the preferred embodiment, however.

A die plate includes bushing plate 31 and manifold plate 32, the die plate defining bushing receiving feature 40 for retention of the bushings, to be discussed hereafter. In the illustrated embodiment bushing receiving feature aperture 40 is composed of first diameter 33 and second diameter 41, these diameters formed respectively in bushing plate 31 and manifold plate 32. These diameters may be concentric, and in the preferred multiple punch embodiment form a series of apertures which open on surface 34 of the die plate which faces workpiece 24. Manifold plate 32 of the die plate also includes port 30 for introducing gas flow into bushing receiving feature 40. The gas may be any type of gas suitable for removing punch slug 28 from punch 20. In the illustrated embodiment compressed air is preferably used for slug removal.

The apparatus has a support bushing 38 for support of workpiece 24, which is mounted in bushing receiving feature 40. In the preferred embodiment this bushing is fabricated from carbide steel and is pressed into bushing plate 31. End wall 51 of bushing 38 has workpiece supporting surface 35 which includes an opening 36 providing clearance for punch 20 and attached slug 28. The workpiece support surface 35 of support bushing 38 is preferably offset with respect to workpiece facing surface 34 of bushing plate 31 so that it is elevated with respect to surface 34. Workpiece 24 rests on bushing 38 rather than on bushing plate 31, which prevents marring damage to workpiece 24. In the multiple punch configuration, of course, a whole series of support bushings defines the surface on which the workpiece rests.

Figure 3:
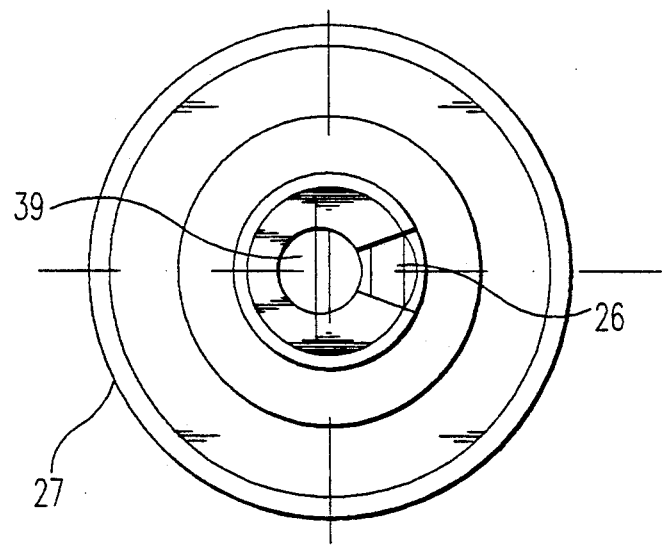
FIG. 3 shows a top view of the slug removal bushing of the present invention.

Slug removal bushing 27 for removal of punch slugs is mounted in bushing receiving feature 40. A first end 37 of slug removal bushing 27 is proximate to end wall 51 of support bushing 38 on the side of the end wall opposite workpiece supporting surface 35. First end 37 provides clearance 39 for passage of punch 20 and attached workpiece slug 28. This clearance for passage of the punch and attached workpiece slug is an end clearance. Slug removal bushing 27 also has clearance for passage of the gas flow, which in the preferred embodiment is side wall clearance 26. FIG. 3, which is a top view of slug removal bushing 27, illustrates end clearance 39 and side wall clearance 26, which in the preferred embodiment is a slot in the end of the slug removal bushing.

The bushings 27 and 38 and bushing receiving feature 40 together are integrated to define flow passage 29 for transmission of the gas flow from port 30 to the clearance defined by slot 26, as is indicated by the arrows in FIG. 2. Since clearance 26 is taken from end 37 proximate end wall 51, the gas is delivered directly adjacent end wall 51.

It is important that the exit of slot 26 be as close to punch 20 and slug 28 as possible. It is also desirable that wall 52 opposing slot 26 be as far away from slug 28 as practical. This configuration helps prevent contaminant particles from being expelled through opening 36, which could lead to contamination of bushing 21. The above described objectives are achieved by providing an offset between opening 36 and opening 39, as shown in FIG. 2. The shape of slot 26 also helps to direct the gas flow downward and away from green sheet 24. In the illustrated embodiment, this configuration provides a velocity at the exit of slot 26 of approximately 230 m/sec, thus ensuring positive slug removal.

Slug removal bushing 27 may be fabricated from a deformable polymeric material. In the configuration currently being practiced by the inventors, this material is polyoxymethylene. In the illustrated embodiment, a first section of the die plate is bushing plate 31, into which support bushing 38 is pressed. A second section of the die plate is manifold plate 32, which at least partially contains slug removal bushing 27 and into which slug removal bushing 27 is pressed. The attachment of these plates forms a concentric bushing arrangement and forms a seal 44 when the deformable material of bushing 27 is pressed into bushing 38 to abut end wall 51. This seal enhances the gas flow to concentrate it in such a manner as to positively remove punch slug 28 from punch 20. The plates can be separated for rework of workpiece supporting surface 35 of bushing 38 as it wears due to impact from punch 20. Bushing 38 can also be removed and replaced when its rework limit is reached without necessitating the replacement of slug removal bushing 27.

In the illustrated embodiment bushing receiving feature 40 is composed of first die plate diameter 33 and second die plate diameter 41, which are concentric. When bushing plate 31 and manifold plate 32 are attached support bushing 38 and slug removal bushing 27 form a concentric bushing arrangement. The support bushing is disposed in first die plate diameter 33 at bushing diameter 25 and slug removal bushing 27 is stepped, having first diameter 43 which is disposed in second die plate diameter 41 and having second diameter 42 which is disposed within support bushing 38 to form an annular region between the two bushings.

Slug removal bushing 27 defines slug removal passage 45 opposite workpiece 24 for removal of punch slugs 28. Disposal of the punch slugs which have been removed by the gas flow is enhanced by subjecting the slug removal passage to an applied vacuum by means well known to those skilled in the art, which are not shown in FIG. 2.

Figure 1:
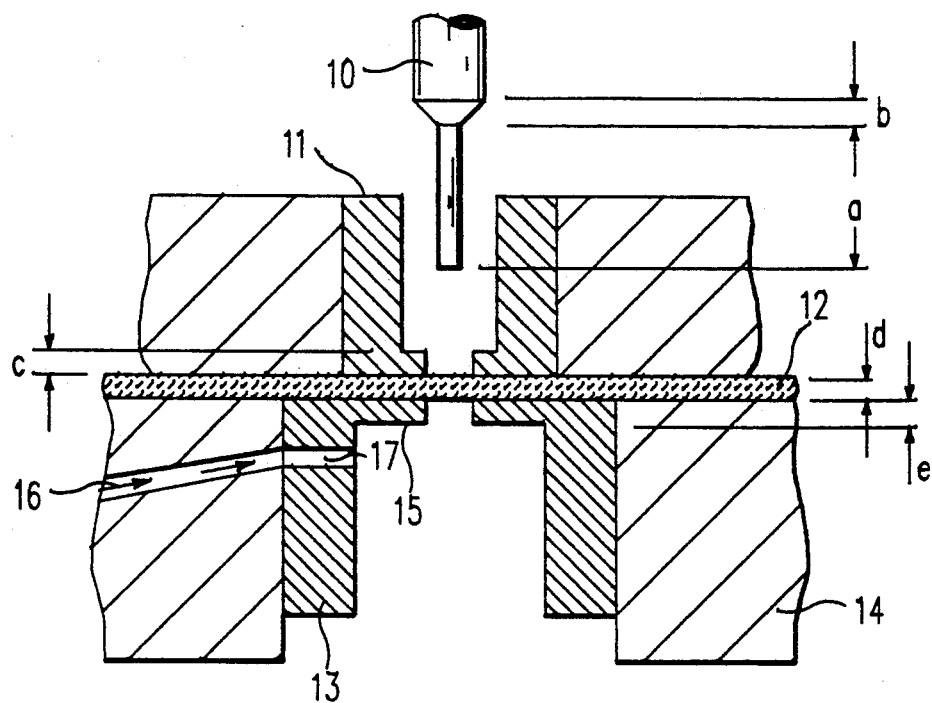
FIG. 1 shows a prior art punching apparatus.
Figure 4:
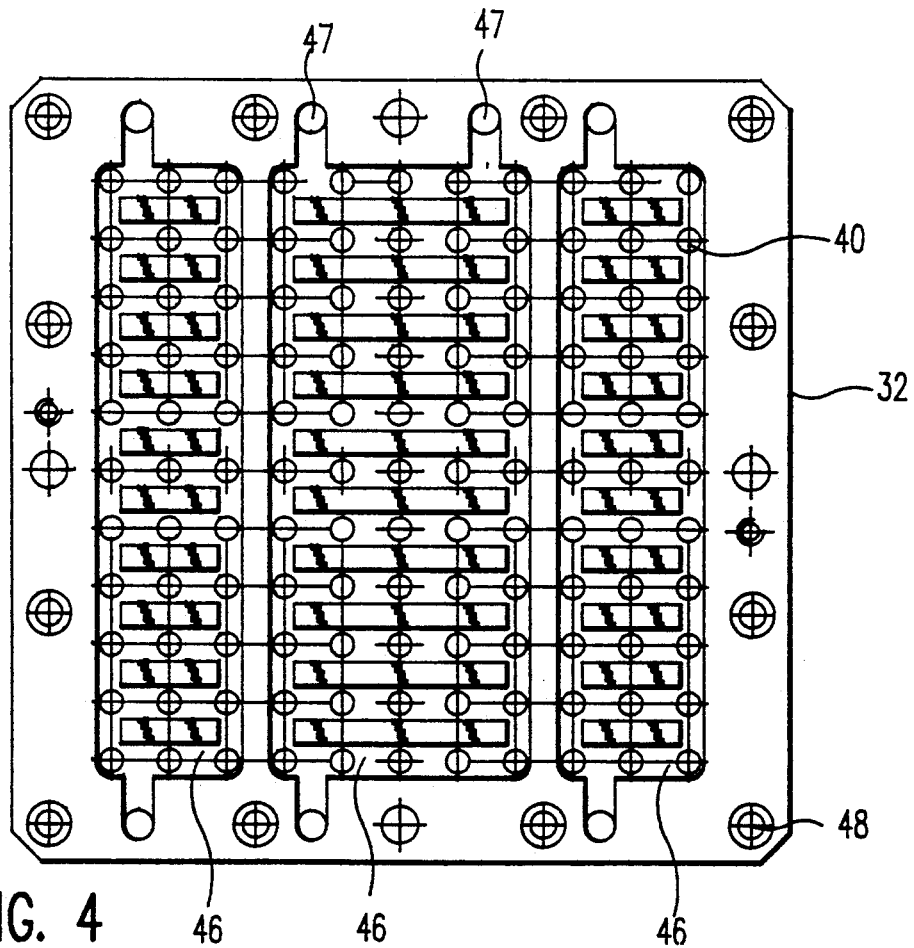
FIG. 4 shows the top view of a manifold plate of a multiple punch die plate of one configuration of the apparatus of the present invention.

Application of the current invention to a multiple punch single stroke punch apparatus is illustrated in FIG. 4, which shows a top view of manifold plate 32 having a plurality of bushing receiving features 40. Manifold plate 32 has a series of machined gas passages 46. At least one of these gas passages intersects each bushing receiving feature 40 and thus corresponds to port 30 shown in FIG. 2. In the preferred embodiment, compressed air is introduced to gas passages 46 through air ports 47, at least one of which provides air flow to each gas passage. The compressed air may be introduced to air ports 47 through a common air supply. Means for manifolding and supplying this air are well known to those skilled in the art and are not illustrated in FIG. 4. Manifold plate 32 also contains various mounting and fixturing features 48.

The illustrated apparatus thus provides a method for single stroke punching which includes the steps of providing workpiece 24 proximate to workpiece receiving surface 34 of a die plate defining aperture 40, punching slug 28 from workpiece 24 through clearance feature 36 of end wall 51 of support bushing 38 disposed in the aperture, directing a gas flow through flow passage 29 defined by support bushing 38, the die plate wall of aperture 40, and slug removal bushing 27 disposed in the aperture, and impinging the gas flow on slug 28 attached to punch 20 proximate end wall 51 to remove the slug from the punch through slug removal passage 45 of the slug removal bushing. The method preferably includes elevating the workpiece with respect to the workpiece receiving feature on first surface 35 of end wall 51. If a non-programmable multiple punch head is used, the method may also include inserting an interposer defining a desired punch pattern between punch 20 and workpiece 24. Assistance in punch slug removal may be provided by applying a vacuum to slug removal passage 45 of slug removal bushing 27.

Implementation of the present invention has allowed single stroke punching. The invention essentially provides positive 100% punch slug removal, with minimal defective sheets, when used for punching ceramic green sheets and provides significant process time improvement over the previously practiced double stroke punching method.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

Having thus described my invention, what we claim as new and desire to secure by Letters Patent is as follows:

1. A method for single stroke punching comprising the steps of:

providing a workpiece proximate a workpiece receiving surface of a die plate defining an aperture;

punching a slug from the workpiece through a clearance feature of an end wall of a support bushing deposed in the aperture;

directing a gas flow through a flow passage defined by the support bushing, the interior wall of the die plate of the aperture, and a deformable polymeric slug removal bushing disposed in the aperture; and impinging the gas flow on the slug attached to the punch proximate the end wall to remove the slug from the punch through a slug removal passage of the slug removal bushing.

2. The method of claim 1 further comprising the step of elevating the workpiece with respect to the workpiece receiving surface on a first surface of the end wall.

3. The method of claim 2 further comprising the step of inserting an interposer defining a desired punch pattern between the punch and the workpiece.

4. The method of claim 2 further comprising providing a vacuum to the slug removal passage to assist slug removal from the slug removal bushing.

5. An apparatus for removing workpiece slugs from a punch comprising:
a die plate having at least one bushing receiving feature, the die plate having a first surface and having means for introducing gas flow into the feature;
at least one support bushing having an end shall wall with a workpiece supporting surface which defines a first opening for passage of the punch and an attached workpiece slug, wherein the at least one support bushing is disposed in the bushing receiving feature;
at least one deformable polymeric slug removal bushing disposed in the bushing receiving feature such that a first end is proximate an end wall of the support bushing opposite the workpiece supporting surface, wherein the first end provides a clearance for passage of the punch, the attached workpiece slug, and the gas flow;
wherein the bushings and bushing receiving feature define a flow passage for directing the gas flow through the clearance to remove the slug from the punch.

6. The apparatus of claim 5 wherein the workpiece supporting surface is elevated with respect to the die plate first surface and 7. The apparatus of claim 5 wherein the first end of the slug removal bushing and the support bushing end wall form a seal.

8. The apparatus of claim 5 wherein the die plate comprises a first section bushing plate containing the support bushing and an attached second section manifold plate at least partially containing the slug removal bushing, the attachment forming a concentric bushing arrangement.

9. The apparatus of claim 5 wherein the bushing receiving feature comprises first and second concentric die plate diameters and the support and slug removal bushings form a concentric bushing arrangement.

10. The apparatus of claim 9 wherein the support bushing is disposed in the first die plate diameter and the slug removal bushing comprises a stepped bushing having first and second diameters, the first slug removal bushing diameter disposed in the second die plate diameter and the second slug removal bushing diameter disposed in the support bushing to form an annular region between the bushings.

11. The apparatus of claim 10 wherein the first end of the slug removal bushing and the support bushing end wall abut to form a seal.

12. The apparatus of claim 5 wherein the slug removal bushing clearance comprises end clearance for passage of the punch and the attached workpiece slug and comprises side wall clearance for passage of the gas flow directly adjacent the support bushing end wall.

13. The apparatus of claim 5 wherein the die plate comprises a plurality of bushing receiving features and the gas introducing means comprises a manifold and a plurality of gas passages in the die plate.

14. The apparatus of claim 5 wherein a second end of the slug removal bushing defines a slug removal passage subject to an applied vacuum.

15. A single-stroke punch apparatus comprising:
punch means;
bushing retention means;
a support bushing mounted in the retention means, the support bushing providing support for a workpiece to be punched, the bushing defining a clearance for the punch means;
a deformable polymeric slug removal bushing mounted in the retention means, the slug removal bushing providing an internal passage for the removal of punch slugs from the apparatus, wherein the slug removal bushing, the support bushing, and the retention means are integrated to define a flow passage to the punch clearance of the support bushing; and
means for introducing a gas flow to the flow passage.

16. The apparatus of claim 15 further comprising a die plate having a workpiece facing surface, wherein the die plate defines a series of apertures comprising the bushing retention means, the apertures opening on the workpiece facing surface and wherein pairs of support and slug removal bushings are engaged in each aperture, the workpiece support of the support bushing being vertically offset with respect to the workpiece facing surface.

17. The apparatus of claim 16 wherein the gas flow introducing means comprises a plurality of gas passages in the die plate and wherein at least one of the gas passages intersects each aperture to provide a gas source to the flow passage defined by the bushings.

18. The apparatus of claim 16 wherein the apertures comprise first and second concentric die plate diameters and the support and slug removal bushings form a concentric bushing arrangement.

19. The apparatus of claim 18 wherein the support bushing is disposed in the first die plate diameter and the slug removal bushing comprises a stepped bushing having first and second diameters, the first slug removal bushing diameter disposed in the second die plate diameter and the second slug removal bushing diameter disposed in the support bushing.

20. The apparatus of claim 16 wherein the slug removal bushing defines a slug removal passage opposite the workpiece facing surface, the slug removal passage being subject to an applied vacuum.

21. The apparatus of claim 15 wherein the workpiece support comprises a first surface of an end wall of the support bushing and the integration of the bushings forms a seal at a second surface of the end wall opposite the first surface.

* * * * *